(12) United States Patent
Dannoune et al.

(10) Patent No.: US 12,308,373 B2
(45) Date of Patent: May 20, 2025

(54) OPTOELECTRONIC DEVICE WITH TRANSITION AREAS

(71) Applicant: ALEDIA, Echirolles (FR)

(72) Inventors: Mehdi Dannoune, Renage (FR); Tiphaine Dupont, Grenoble (FR)

(73) Assignee: ALEDIA, Echirolles (FR)

( * ) Notice: Subject to any disclaimer, the term of this patent is extended or adjusted under 35 U.S.C. 154(b) by 0 days.

(21) Appl. No.: 18/342,106

(22) Filed: Jun. 27, 2023

(65) Prior Publication Data
US 2024/0355959 A1 Oct. 24, 2024

(30) Foreign Application Priority Data

Jun. 30, 2022 (FR) ...................................... 2206586

(51) Int. Cl.
*H01L 33/08* (2010.01)
*H01L 33/06* (2010.01)
*H01L 33/24* (2010.01)

(52) U.S. Cl.
CPC .............. *H01L 33/08* (2013.01); *H01L 33/06* (2013.01); *H01L 33/24* (2013.01)

(58) Field of Classification Search
CPC .......... H01L 33/06; H01L 33/08; H01L 33/24
See application file for complete search history.

(56) References Cited

U.S. PATENT DOCUMENTS

| | | | |
|---|---|---|---|
| 2006/0192217 A1 | 8/2006 | David et al. | |
| 2016/0056330 A1 | 2/2016 | Scaringella et al. | |
| 2019/0363069 A1* | 11/2019 | Ahmed | H01L 25/0753 |
| 2023/0155063 A1* | 5/2023 | Kim | H01L 33/382 |
| | | | 257/79 |

FOREIGN PATENT DOCUMENTS

| | | |
|---|---|---|
| JP | 2008532314 A | 8/2008 |
| WO | 2014154880 | 10/2014 |
| WO | 2014154880 A1 | 10/2014 |

(Continued)

OTHER PUBLICATIONS

Andrews et al., "Melt-processed polymer multilayer distributed feedback lasers: Progress and prospects", 2014 Journal of Polymer Science Part B: Polymer Physics, vol. 52, Issue 3, p. 251-271.

(Continued)

*Primary Examiner* — Mark W Tornow
(74) *Attorney, Agent, or Firm* — HAUPTMAN HAM, LLP

(57) ABSTRACT

An optoelectronic device including a first LED forming a first active structure and including first nanowires having first diameters $\varphi 1$ such that $0.9 \cdot \varphi 10 < \varphi 1 < 1,1 \cdot \varphi 10$ with $\varphi 10$ a target value of the first diameters, the first nanowires being arranged according to at least one first array with a step $p1$, said first LED being configured to emit a first light beam having mainly a first wavelength $\lambda 1$, and a first transition area bordering at least partially the first LED, the first transition area including a plurality of first transition nanowires, the device being characterised in that the first transition nanowires have first transition diameters and/or a first transition array step varying progressively when moving away from the first LED.

20 Claims, 8 Drawing Sheets

(56) References Cited

FOREIGN PATENT DOCUMENTS

WO      2022002896 A1     1/2022
WO      2022069431 A1     4/2022

OTHER PUBLICATIONS

Sun et al., "Surface-emitting circular DFB, disk-, and ring-Bragg resonator lasers with chirped gratings. II: nonuniform pumping and far-field patterns", Optics Express, 2009, vol. 17, No. 1, p. 1-6.
French Search Report issued in corresponding French Application No. 2206586, mailed Feb. 10, 2023, pp. 1-15, French Intellectual Property Office, Courbevoie Cedex, France.

* cited by examiner

[Fig. 1]
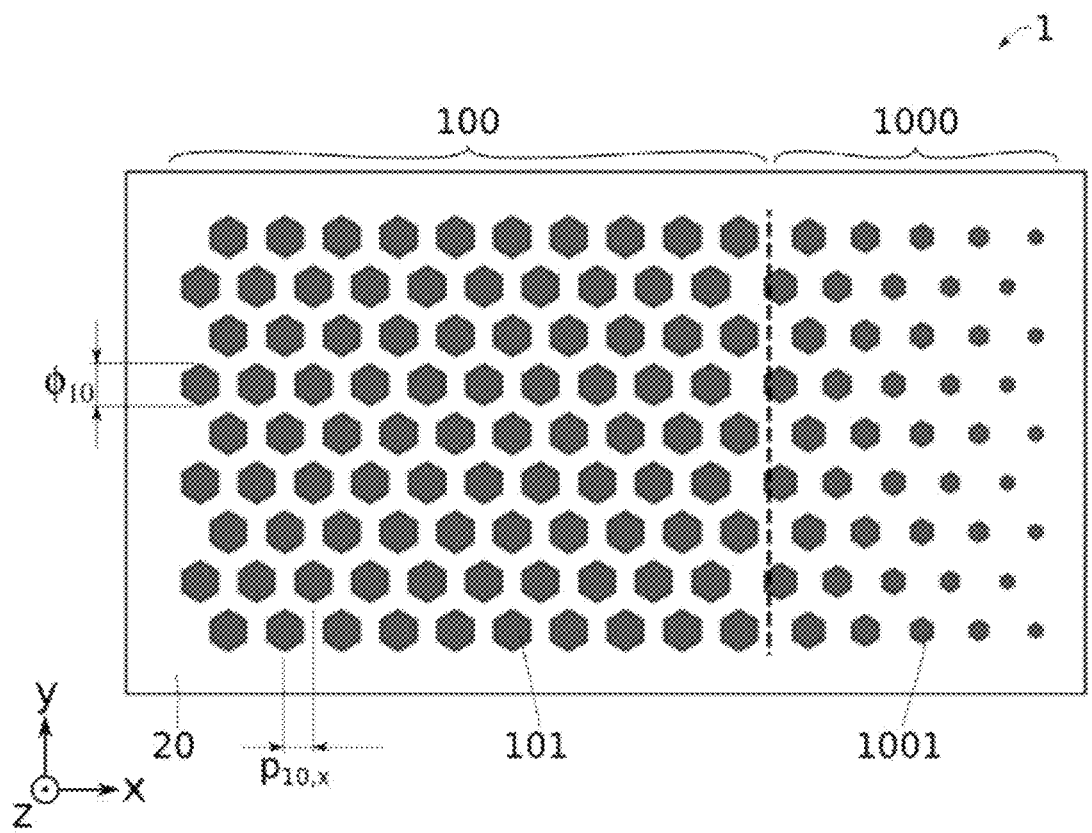
[Fig. 2]
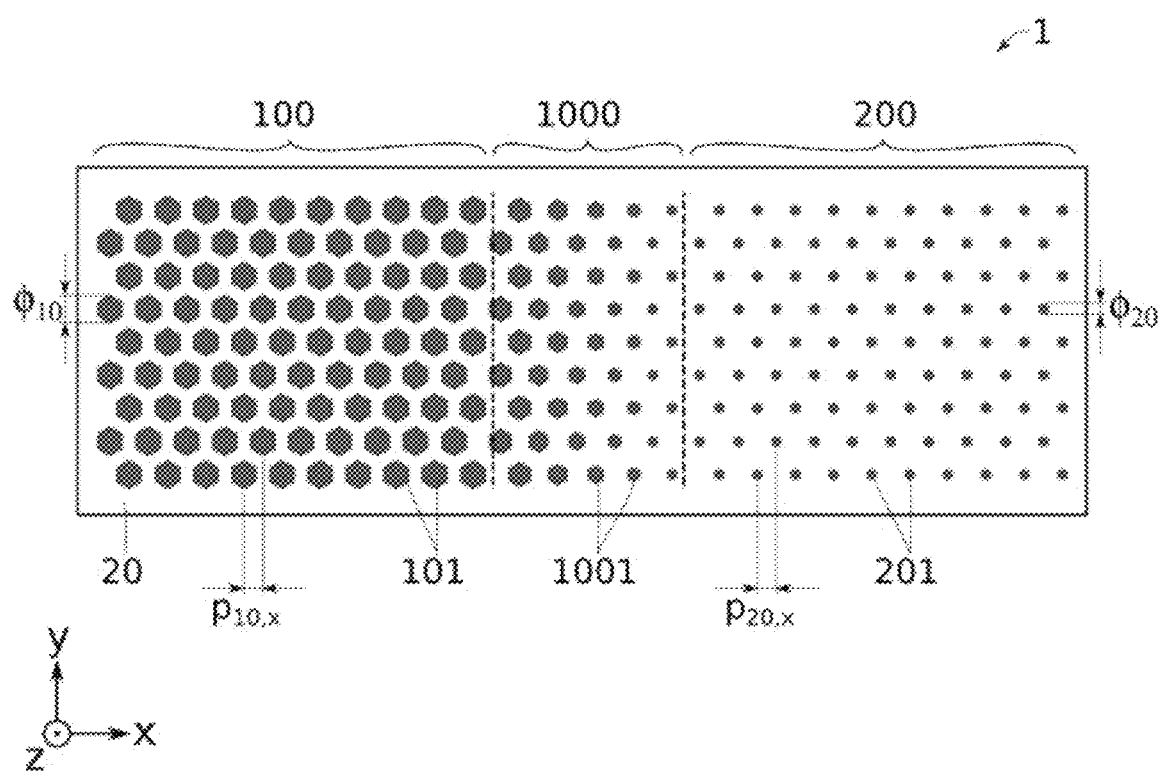

[Fig. 3]
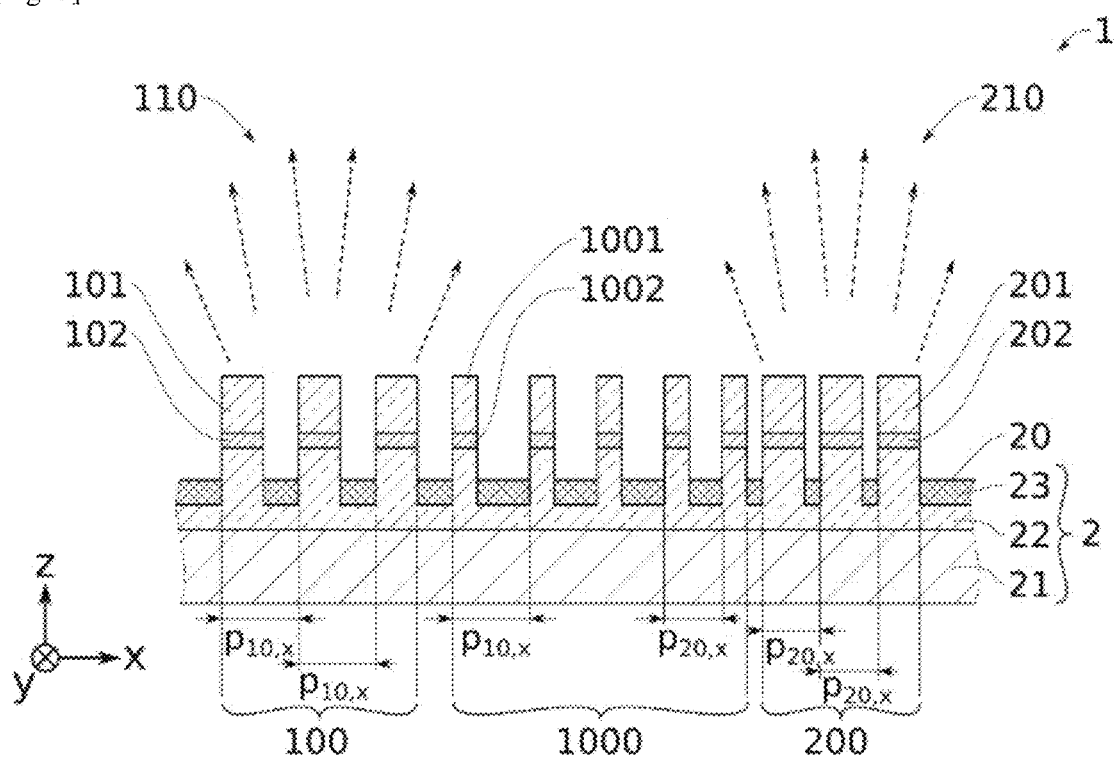

[Fig. 4a]
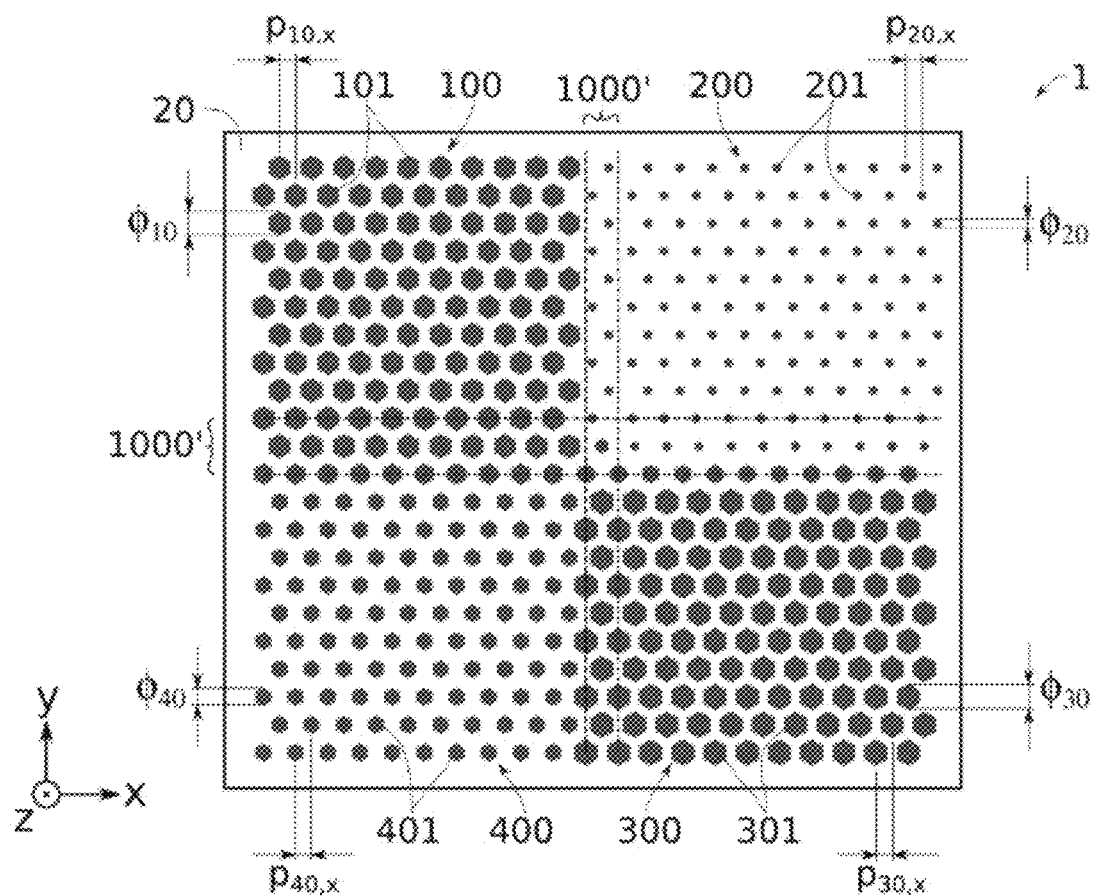

[Fig. 4b]
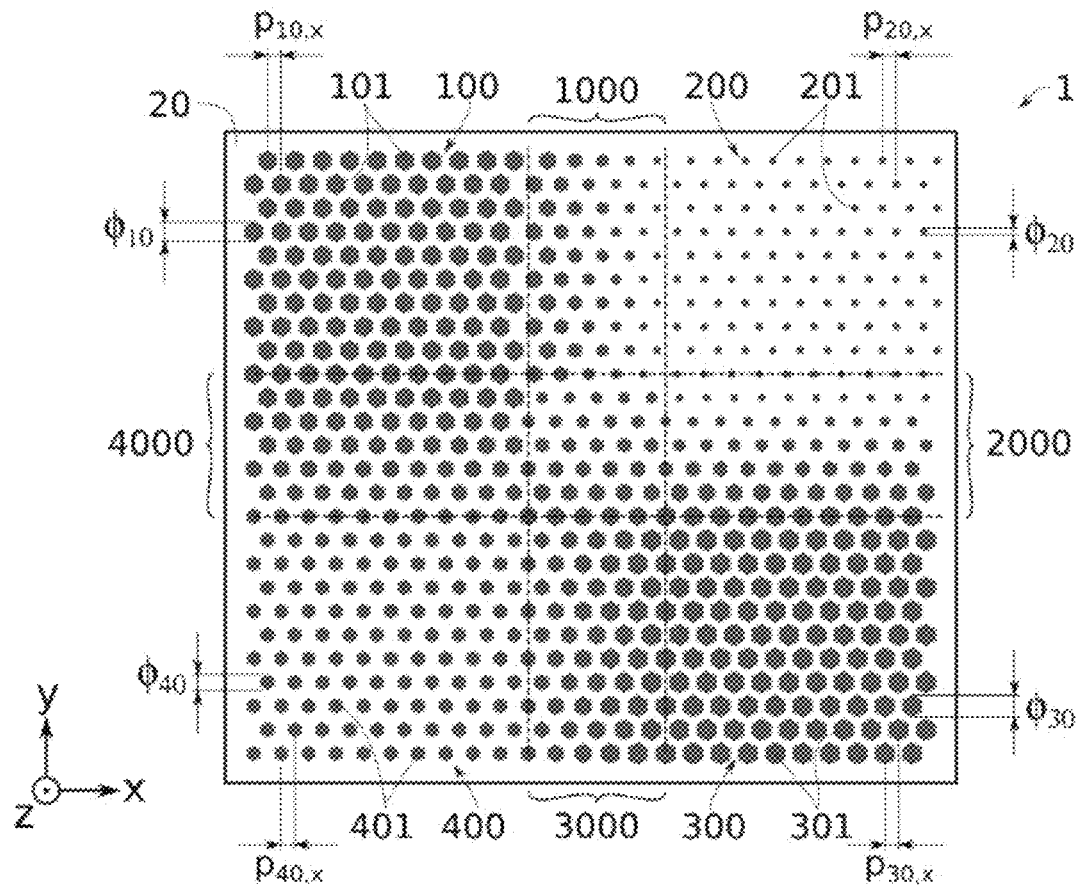
[Fig. 5]
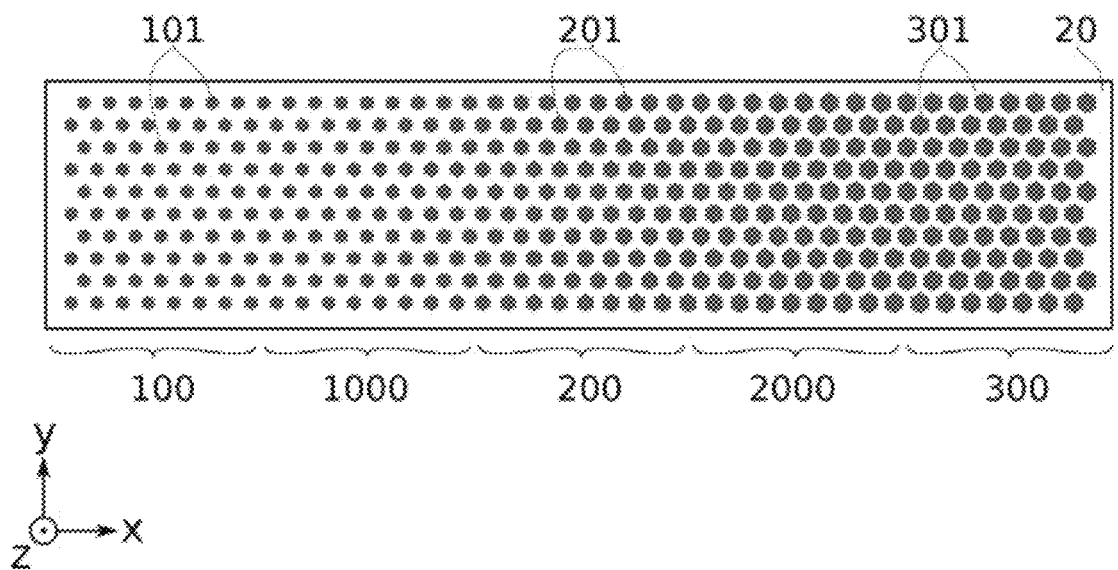

[Fig. 6a]
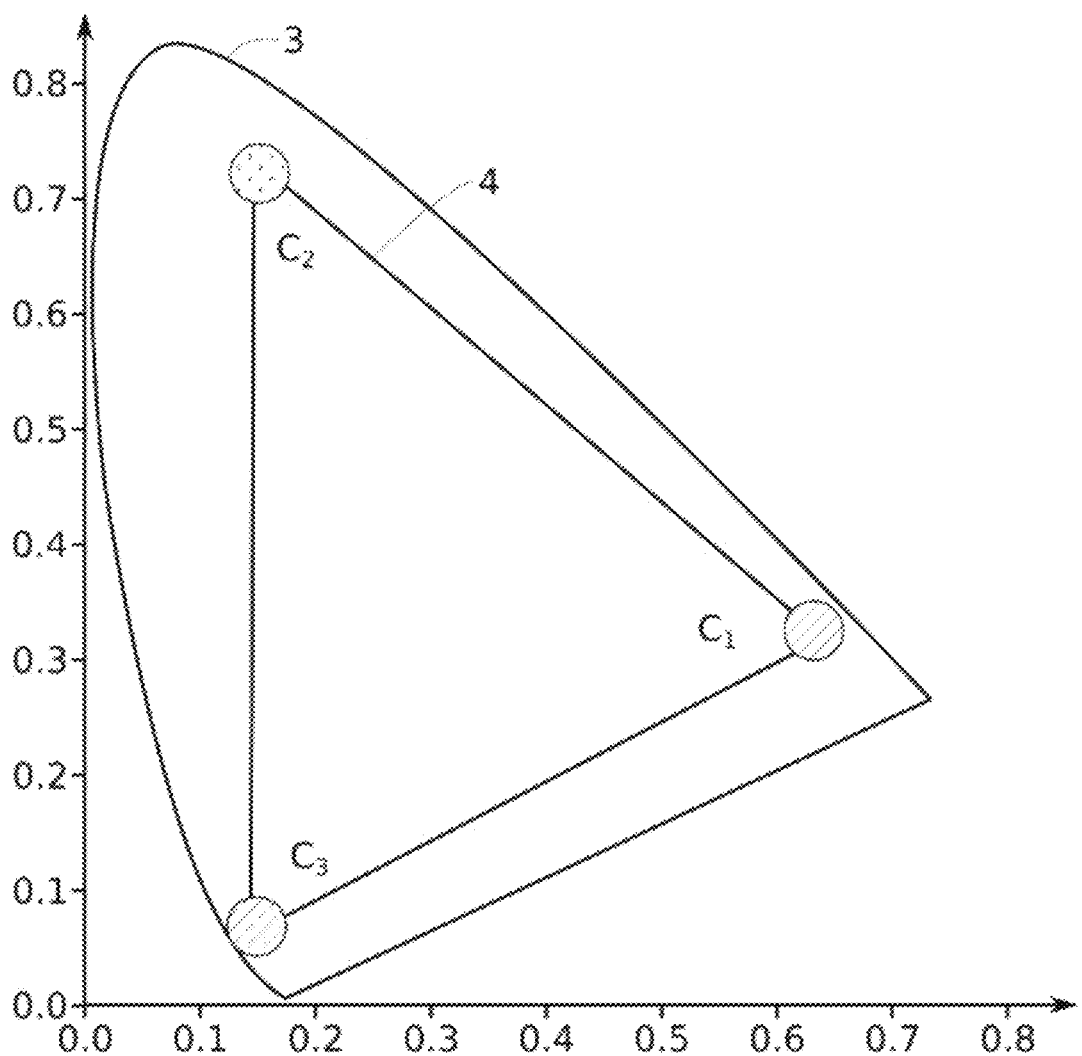

[Fig. 6b]
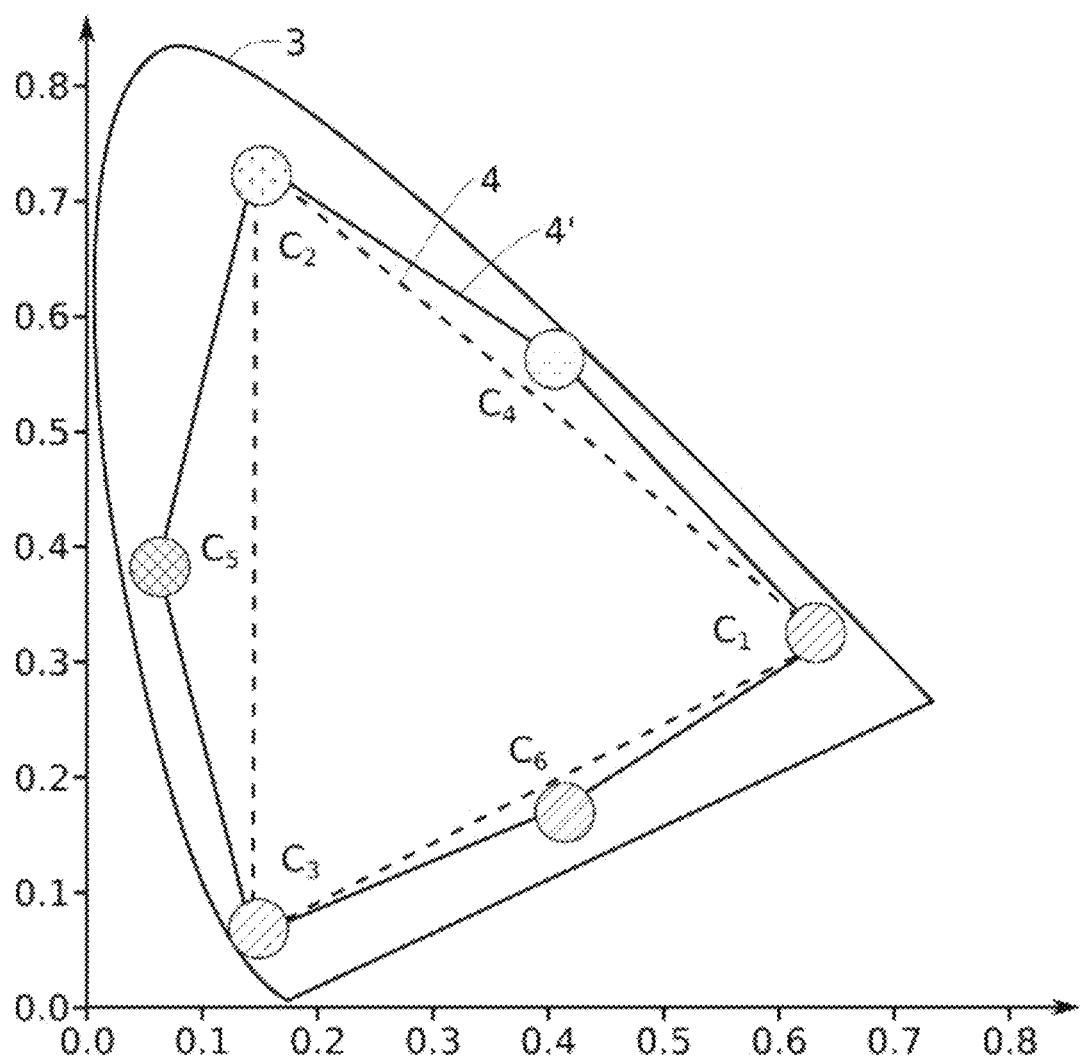

[Fig. 7]
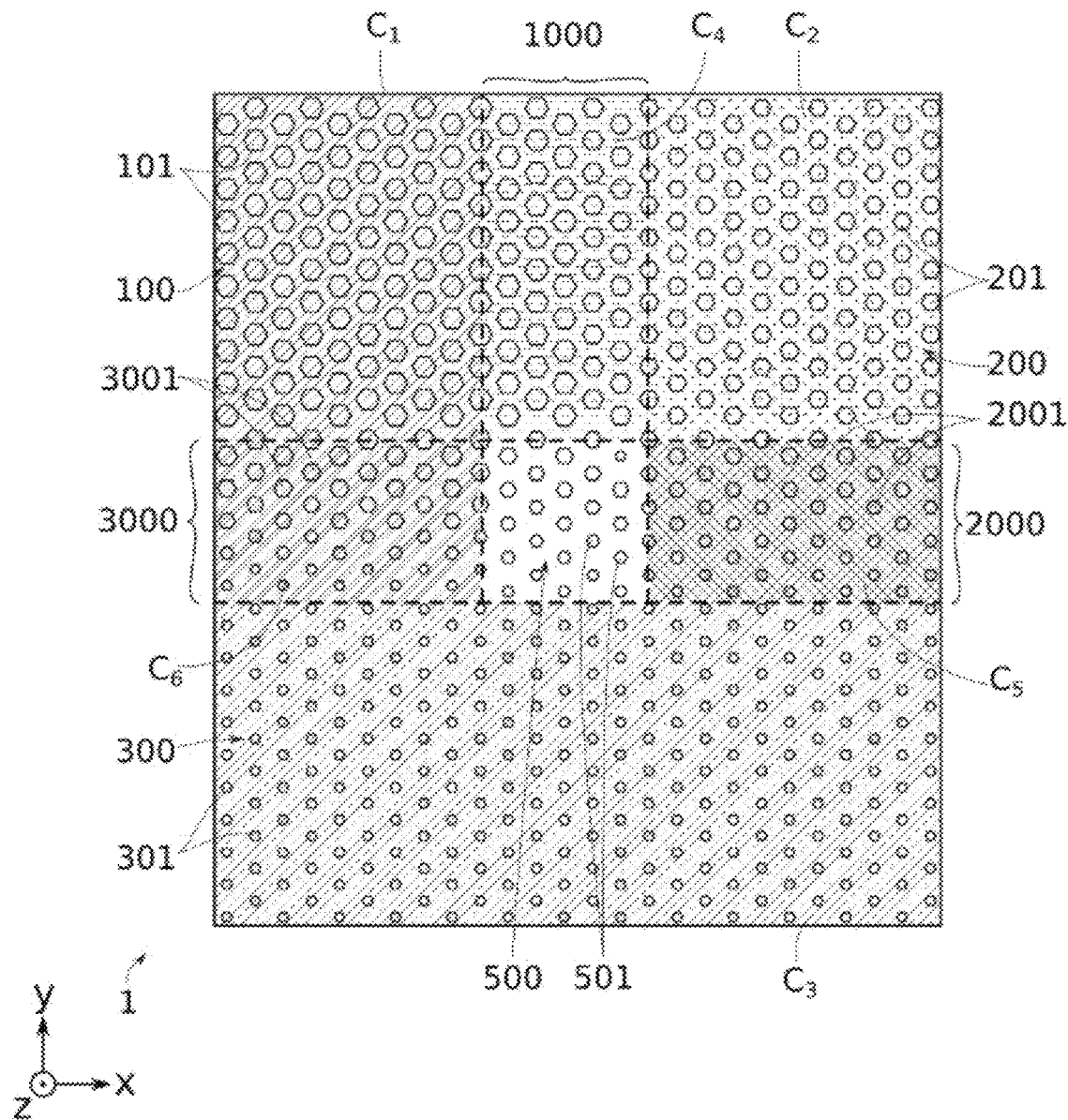

[Fig. 8]
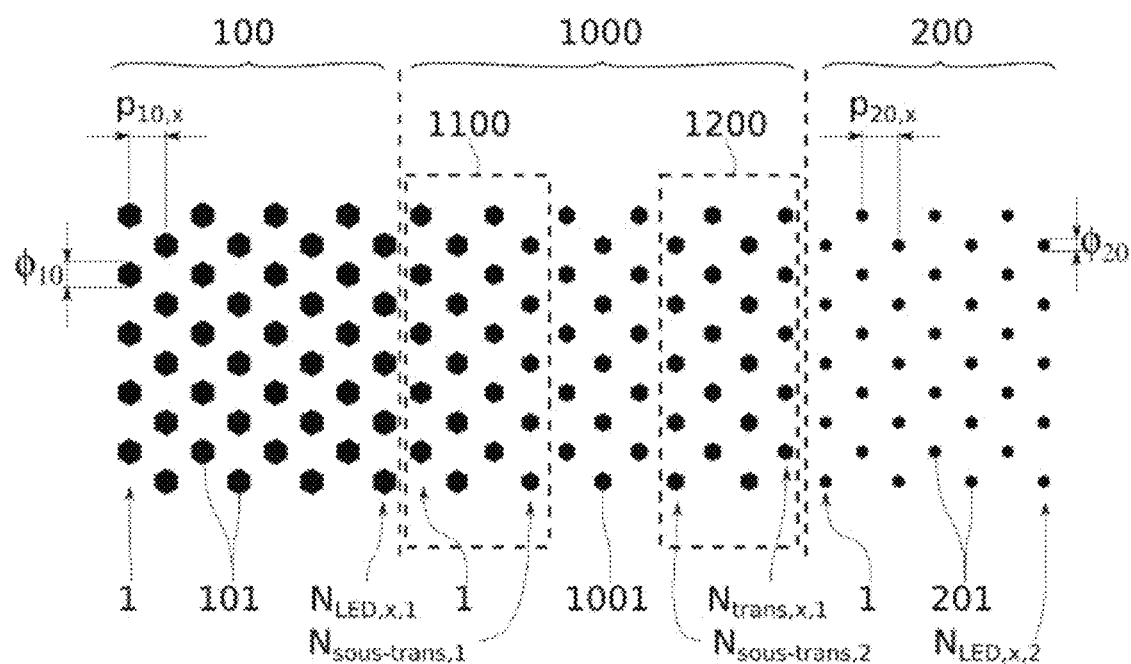

OPTOELECTRONIC DEVICE WITH TRANSITION AREAS

TECHNICAL FIELD

The present invention relates in particular to the field of microelectronics and optoelectronics technologies. It finds a particularly advantageous, yet non-limiting, application in LED ("Light-Emitting Diode") based display systems.

PRIOR ART

In general, a display screen comprises a plurality of pixels disposed on a so-called basal plane and emitting independently of one another. In general, each colour pixel comprises at least three components for emitting and/or converting a luminous flux, also called subpixels. Each of these subpixels emits a luminous flux substantially in one single colour (typically red, green and blue). The colour of one pixel perceived by an observer results from the superimposition of the different luminous fluxes emitted by the subpixels.

Typically, a LED or micro-LED allows emitting the luminous flux associated with a subpixel. In particular, a LED may comprise a plurality of active nanowires arranged into a periodic photonic crystal and emitting said luminous flux at the desired wavelength. In particular, this photonic crystal is characterised by the diameter of the nanowires and the step between the nanowires.

FIG. 4a illustrates a conventional arrangement of subpixels within a pixel. Yet, in practice, this arrangement type does not offer optimum performances. Hence, there is a need to improve the performances of self-emissive pixels based on nanowires.

SUMMARY

To achieve this objective, according to one embodiment, an optoelectronic device is provided comprising at least:
  a first LED extending mainly in a plane defined by a first direction and a second direction, said first LED comprising a plurality of first nanowires having first diameters having a value substantially equal to a first target diameter $\varphi 10$ and organised into $N_{LED,x,1}$ rows directed according to the second direction, called first rows, said first rows being separated by first distances considered according to the first direction having a value substantially equal to a first target distance $p_{10,x}$, said first LED being configured to emit a first light beam having mainly a first wavelength $\lambda_1$, and
  a first transition are extending mainly in the plane and bordering at least partially said first LED, said first transition area comprising a plurality of first transition nanowires having first transition diameters and organised into $N_{trans,x,1}$ rows directed according to the second direction, called first transition rows and indexed according to numbering from 1 to $N_{trans,x,1}$ when getting away from the first LED according to the first direction, the first rows being indexed according to numbering from 1 to $N_{LED,x,1}$ according to the first direction when getting close to the first transition area,
the device being characterised in that the first transition area comprises a first transition sub-area formed by the $N_{sub-trans,1}$ first transition rows, with $2 \leq N_{sub-trans,1} \leq N_{trans,x,1}$, bordering the first LED, in which first transition sub-area:

the first transition nanowires are such that:
    i. the value of the first transition diameters of the first transition nanowires of the first transition row No. 1 varies within a proportion lower than 5% of the first target diameter $\varphi_{10}$, and
    ii. the value of the first transition diameter of each first transition nanowire of any first transition row No. i, i being comprised between 2 and $N_{sub-trans,1}$, varies within a proportion comprised between 3% and 13% of the value of the first transition diameter of the first transition nanowire of the first transition row No. i−1 the closest thereto,
  and/or
  the first transition nanowires are such that:
    i. the first row No. $N_{LED,x,1}$ and the first transition row No. 1 being separated according to the first direction x by a first interface distance $d_{interface,1}$, the first interface distance $d_{interface,1}$ and the distance according to the first direction between the first transition row No. 1 and the first transition row No. 2 vary within a proportion comprised between 2% and 4% of the distance according to the first direction between the first row No. $N_{LED,x,1}-1$ and the first row No. $N_{LED,x,1}$ and the first interface distance $d_{interface,1}$ respectively,
    ii. the distance according to the first direction between any first transition row No. i and the first transition row No. i+1 varies within a proportion comprised between 2% and 4% of the distance according to the first direction between the first transition row No. i−1 and the first transition row No. i, i being comprised between 2 and $N_{sub-trans,1}-1$.

The optoelectronic device may also be described as comprising at least:
  a first LED comprising a plurality of first nanowires having first diameters having a value substantially equal to a first target diameter value $\varphi_{10}$ and organised into rows directed according to a second direction, called first rows, and separated by first distances considered according to a first direction having a value substantially equal to a first target distance value $p_{10,x}$, said first LED being configured to emit a first light beam having mainly a first wavelength $\lambda_1$, and
  a first transition area bordering at least partially said first Led and comprising a plurality of first transition nanowires having first transition diameters and organised into rows directed according to the second direction, called first transition rows, and separated by first transition distances according to the first direction,
said first LED and said first transition area being separated, between a first row and a first transition row adjacent to one another, by a first interface distance according to the first direction, the device being characterised in that, when getting away from the first LED according to the first direction:
  the value of the first transition diameters of the first transition row adjacent to the first LED varies within a proportion lower than 5% of the first target diameter value, and the value of the first transition diameters gradually varies, between two adjacent first transition rows, within a proportion comprised between 3% and 13%,
and/or
  the value of the first interface distance is comprised between 2% and 4% of the first target distance value, the value of the distance between the first transition row adjacent to the first LED and the first transition row adjacent thereto is comprised between 2% and 4% of the first interface distance, and the value of the first transition distances gradually varies, between two adjacent first transition rows, within a proportion comprised between 2% and 4%.

Indeed, a major issue of these technologies concerns the transition areas between adjacent subpixels. Indeed, the subpixels forming the current display screens are typically affixed to one another while a subpixel quite often has a nanowire diameter and a step between the nanowires different from the neighbouring subpixel. Only abrupt transition areas 1000' separate the subpixels, as represented in FIG. 4a. The same applies at the upper level, between the pixels. The presence of these abrupt transition areas 1000' has the drawback of distorting the symmetry of the array and, consequently, creating edge effects that are detrimental during the growth of the nanowires. These edge effects also prevent achieving an advantageous optical cavity effect at each subpixel.

The presence of a transition area allows avoiding any symmetry discontinuity and reducing the edge effect phenomenon.

According to an advantageous possibility, the transition nanowires also allow extending the gamut of a set of subpixels, i.e. the set of colours it could render. Indeed, the spectrum of colours that could be emitted by a pixel is typically limited to the set of colours included within a triangle defined by the native colours emitted by three subpixels forming said pixel on the chromaticity diagram of the CIE (International Commission on Illumination) XYZ colorimetric system, typically red ($C_1$), green ($C_2$) and blue ($C_3$), as shown in FIG. 6a. The colours included within this triangle, called gamut 4, are actually obtained by linear combinations of the three native colours emitted by the three subpixels of the pixel. Thus, only a reduced range of chromaticity could be obtained. The present invention provides a solution to extend this range.

Thus, for this purpose, it is provided that the first transition nanowires to have an active region configured to emit a first transition light beam having mainly a first transition wavelength distinct from the first wavelength $\lambda 1$.

BRIEF DESCRIPTION OF THE FIGURES

The aims, purposes, characteristics and advantages of the invention will be better understood upon reading the detailed description of one embodiment thereof, which is illustrated by means of the following accompanying drawings, in which:

FIG. 1 shows a top view of the device according to an embodiment of the invention, comprising one LED and a transition area.

FIG. 2 shows a top view of the device according to an embodiment of the invention, comprising two LEDs separated by a transition area.

FIG. 3 shows a cross-section of the device according to an embodiment of the invention, comprising two LEDs separated by a transition area.

FIG. 4a shows a device with four LEDs having abrupt transition areas between the LEDs, according to the prior art.

FIG. 4b shows a device with four LEDs according to an embodiment of the invention, this device having progressive transition areas between the LEDs.

FIG. 5 shows a device according to the invention with three LEDs separated by progressive transition areas.

FIG. 6a shows the chromaticity diagram of a pixel commonly used in current display screens.

FIG. 6b shows the chromaticity diagram of a pixel that could be obtained thanks to the device object of the invention.

FIG. 7 shows a device with three LEDs according to an embodiment of the invention, this device having active progressive transition areas between the LEDs as well as an intermediate region emitting white light.

FIG. 8 shows a device according to the invention with two LEDs separated by a progressive transition area.

The drawings are provided by way of example and are not intended to limit the scope of the invention. They constitute diagrammatic views intended to ease the understanding of the invention and are not necessarily to the scale of practical applications. In particular, the dimensions of each of the elements do not represent reality.

DETAILED DESCRIPTION

Before starting a detailed review of embodiments of the invention, optional features that may be used in combination or alternatively are set out hereinafter:

According to one embodiment, the first transition diameters of the first transition nanowires of the same first transition row are equal.

According to one embodiment:
the value of the first transition diameters of the first transition nanowires of the first transition rows has a strictly increasing or strictly decreasing variation over at least three successive first transition rows when getting away from the first LED, and/or
the distance between two successive first transition rows when getting away from the first LED has a strictly increasing or strictly decreasing variation over at least three successive first transition rows when getting away from the first LED.

According to one embodiment:
the value of the first transition diameters of the first transition nanowires of the first transition rows has a linear variation over at least three successive first transition rows when getting away from the first LED, and/or
the distance between two successive first transition rows when getting away from the first LED has a linear variation over at least three successive first transition rows when getting away from the first LED.

According to one embodiment, the first nanowires and the first transition nanowires are further organised into rows according to the first direction.

According to one embodiment, the first direction and the second direction are orthogonal.

According to one embodiment, the first transition subarea extends over at least three rows, preferably at least five rows, of first transition nanowires.

According to one embodiment, the first transition subarea has a surface $S_{1000}$ and the first LED has a surface $S_{100}$ such that $S_{100}/5 < S_{1000} < S_{100}/2$.

According to one embodiment, the first nanowires on the one hand and the first transition nanowires on the other hand are powered by distinct electrical contacts.

According to one embodiment, the device further comprises:
a second LED extending mainly in the plane, said second LED comprising a plurality of second nanowires having second diameters having a value substantially equal to a second target diameter $\varphi_{20}$ and organised into $N_{LED,x,2}$ rows directed according to the second direction, called second rows, and indexed according to numbering from 1 to $N_{LED,x,2}$ when getting away from the first transition area according to the first direction, said second rows being separated by first distances considered according to the first direction having a value substantially equal to a second target distance $p_{20,x}$, said second LED being configured to emit a second light beam having mainly a second wavelength $\lambda_2$, said first and second LEDs being separated at least by the first transition area.

According to one embodiment, $N_{sub-trans,1} = N_{trans,x,1}$ and:
the value of the first transition diameters of the first transition nanowires of the first transition row No. $N_{sub-trans,1}$ varies within a proportion lower than 5% of the second target diameter $\varphi_{20}$, and/or the second row No. 1 and the first transition row No. $N_{sub-trans,1}$ being separated according to the first diameter of a second interface distance $d_{interface,2}$, the distance according to the first direction between the first transition row No. $N_{sub-trans,1}$ and the first transition row No. $N_{sub-trans,1}-1$ varies within a proportion comprised between 2% and 4% of the second interface distance $d_{interface,2}$.

According to one embodiment, the first transition area comprises a second transition sub-area formed by the first transition rows No. $N_{sub-trans,2}$ to $N_{trans,x,1}$, with $N_{sub-trans,1} \leq N_{sub-trans,2} < N_{trans,x,1}$, in which second transition sub-area:
the first transition nanowires are such that:
 i. the value of the first transition diameters of the first transition nanowires of the first transition row No. $N_{trans,x,1}$ varies within a proportion lower than 5% of the second target diameter $\varphi_{20}$, and
 ii. the value of the first transition diameters of the first transition nanowires of any first transition row No. i, i being comprised between $N_{sub-trans,2}$ and $N_{trans,x,1}-1$, varies within a proportion comprised between 3% and 13% of the value of the first transition diameters of the first transition nanowire of the first transition row No. i+1, and/or
the first transition nanowires are such that:
 i. the second row No. 1 and the first transition row No. $N_{trans,x,1}$ being separated according to the first direction x by a second interface distance $d_{interface,2}$, the distance according to the first direction (x) between the first transition row No. $_{trans,x,1}$ and the first transition row No. $N_{trans,x,1}-1$ and the second interface distance $d_{interface,2}$ vary within a proportion comprised between 2% and 4% of the second interface distance $d_{interface,2}$ and of the distance according to the first direction (x) between the second row No. 1 and the second row No. 2 respectively,
 ii. the distance according to the first direction between any first transition row No. i and the first transition row No. i-1 varies within a proportion comprised between 2% and 4% of the distance according to the first direction between the first transition row No. i and the first transition row No. i+1, i being comprised between $N_{trans,x,1}-1$ and $N_{sub-trans,2}+1$.

According to one embodiment:
the value of the first transition diameters of the first transition nanowires of the first transition rows has a strictly increasing or strictly decreasing variation over at least three successive first transition rows when getting away from the second LED, and/or
the distance between two successive first transition rows when getting away from the first LED has a strictly increasing or strictly decreasing variation over at least three successive first transition rows when getting away from the second LED.

According to one embodiment:
the value of the first transition diameters of the first transition nanowires of the first transition rows has a linear variation over at least three successive first transition rows when getting away from the second LED, and/or
the distance between two successive first transition rows when getting away from the first LED has a linear variation over at least three successive first transition rows when getting away from the second LED.

According to one embodiment, the second rows are spaced apart according to the first direction x by a distance called second step $p_2$.

According to one embodiment, $N_{sub-trans,1} < N_{sub-trans,2}$ and wherein:
the distance between the first transitions rows No. $N_{sub-trans,1}$ to No. $N_{threshold,1}$ with $N_{sub-trans,1} < N_{threshold,1} \leq N_{sub-trans,2}$ is constant, and/or
the first transition diameters of the first transition nanowires of the first transition rows No. $N_{sub-trans,1}$ to No. $N_{threshold,1}$, with $N_{sub-trans,1} < N_{threshold,1} \leq N_{sub-trans,2}$ are constant,
thus forming a sub-area called first threshold sub-area.

According to one embodiment, at least one portion of the first transition nanowires comprises an active region configured to emit a first transition light beam.

According to one embodiment, the first transition light beam has mainly a first transition wavelength $\lambda_{trans,1}$, with $\lambda_{trans,1} \neq \lambda_1$ and $\lambda_{trans,1} \neq \lambda_2$.

According to one embodiment:
the first nanowires are organised into $N_{LED,y,1}$ rows directed according to the first direction, called first secondary rows, indexed according to numbering from 1 to $N_{LED,y,1}$ and separated by first secondary distances considered according to the second direction having a value substantially equal to a first target secondary distance $p_{10,y}$, and
the second nanowires are organised into $N_{LED,y,2}$ rows directed according to the first direction, called second secondary rows and indexed according to numbering from 1 to $N_{LED,y,2}$ and separated by second secondary distances considered according to the second direction having a value substantially equal to a second target secondary distance $p_{20,y}$.

According to one embodiment, the device further comprises:
a third LED extending mainly in the plane, said third LED comprising a plurality of third nanowires having third diameters having a value substantially equal to a third target diameter 30 and organised into $N_{LED,x,3}$ rows directed according to the second direction, called third rows and into $N_{LED,y,3}$ rows directed according to the first direction, called third secondary rows, said third LED being configured to emit a third light beam having mainly a third wavelength $\lambda_3$,
a second transition area extending mainly in the plane and bordering at least partially said second LED and said third LED, said second transition area comprising a plurality of second transition nanowires having second transition diameters and organised into $N_{trans,y,2}$ rows directed according to the first direction, called second secondary transition rows and indexed according to numbering from 1 to $N_{trans,y,2}$ when getting close to the second LED according to the second direction, a third transition area extending mainly in the plane and bordering at least partially said third LED and said first LED, said third transition area comprising a plurality of third transition nanowires having third transition diameters and organised into $N_{trans,y,3}$ rows directed according to the first direction, called third secondary transition rows and indexed according to numbering from 1 to $N_{trans,y,3}$ when getting close to the first LED according to the second direction, said second and third LEDs being separated by the second transition area, said third and first LEDs being separated by the third transition area, wherein the second nanowires of the second transition area are such that:
 i. the value of the second transition diameters of the second transition nanowires of the second transition row No. 1 varies within a proportion lower than 5% of the third target diameter $\varphi_{30}$, and
 ii. the value of the second transition diameter of each second transition nanowire of any second transition row No. i, i being comprised between 2 and $N_{trans,y,2}$, varies within a proportion comprised between 3% and 13% of the value of the second transition diameter of the second transition nanowire of the second transition row No. i–1 the closest thereto, and
 iii. the value of the second transition diameters of the second transition nanowires of the second transition row No. $N_{trans,y,2}$ varies within a proportion lower than 5% of the second target diameter $\varphi_{20}$, and/or
 i. the second secondary row No. 1 and the second secondary transition row No. $N_{trans,y,2}$ being separated according to the second direction (y) by a third interface distance $d_{interface,3}$, the third interface distance $d_{interface,3}$ and the distance according to the second direction (y) between the second secondary transition row No. $N_{trans,y,2}$ and the second secondary transition row No. $N_{trans,y,2}-1$ vary within a proportion comprised between 2% and 4% of the distance according to the second direction (y) between the second secondary transition row No. $N_{trans,y,2}$ and the second secondary transition row No. $N_{trans,y,2}-1$ and the third interface distance $d_{interface,3}$ respectively,
 ii. the distance according to the second direction between any second secondary transition row No. i and the second secondary transition row No. i+1 varies within a proportion comprised between 2% and 4% of the distance according to the second direction between the second secondary transition row No. i–1 and the second secondary transition row No. i, i being comprised between 2 and $N_{trans,y,2}-1$, and
 iii. the third secondary row No. $N_{LED,y,3}$ and the second secondary transition row No. 1 being separated according to the second direction by a fourth interface distance $d_{interface,4}$, the fourth interface distance $d_{interface,4}$ and the distance according to the second direction between the second secondary transition row No. 2 and the second secondary transition row No. 1 vary within a proportion comprised between 2% and 4% of the distance according to the second direction between the third secondary row No. $N_{LED,y,3}$ and the third secondary row No. $N_{LED,y,3}-1$ and the fourth interface distance $d_{interface,4}$ respectively, and wherein the third nanowires of the third transition area are such that:
 i. the value of the third transition diameters of the third transition nanowires of the third transition row No. 1 varies within a proportion lower than 5% of the third target diameter $\varphi_{30}$, and
 ii. the value of the third transition diameter of each third transition nanowire of any third transition row No. i, i being comprised between 2 and $N_{trans,y,3}$, varies within a proportion comprised between 3% and 13% of the value of the third transition diameter of the third transition nanowire of the third transition row No. i–1 the closest thereto, and
 iii. the value of the third transition diameters of the third transition nanowires of the third transition row No. $N_{trans,y,3}$ varies within a proportion lower than 5% of the first target diameter $\varphi_{10}$, and/or
 i. the first secondary row No. 1 and the third secondary transition row No. $N_{trans,y,3}$ being separated according to the second direction by a sixth interface distance $d_{interface,6}$, the sixth interface distance $d_{interface,6}$ and the distance according to the second direction between the third secondary transition row No. $N_{trans,y,3}$ and the third secondary transition row No. $N_{trans,y,3}-1$ vary within a proportion comprised between 2% and 4% of the distance according to the second direction between the third secondary transition row No. $N_{trans,y,3}$ and the third secondary transition row No. $N_{trans,y,3}-1$ and the sixth interface distance $d_{interface,3}$ respectively,
 ii. the distance according to the second direction between any third secondary transition row No. i and the third secondary transition row No. i+1 varies within a proportion comprised between 2% and 4% of the distance according to the second direction between the third secondary transition row No. i–1 and the third secondary transition row No. i, i being comprised between 2 and $N_{trans,y,3}-1$, and
 iii. the third secondary row No. $N_{LED,y,3}$ and the third secondary transition row No. 1 being separated according to the second direction by a fifth interface distance $d_{interface,5}$, the fifth interface distance $d_{interface,5}$ and the distance according to the second direction between the third secondary transition row No. 2 and the third secondary transition row No. 1 vary within a proportion comprised between 2% and 4% of the distance according to the second direction between the third secondary row No. $N_{LED,y,3}$ and the third secondary row No. $N_{LED,y,3}-1$ and the fourth interface distance $d_{interface,4}$ respectively.

According to one embodiment, further comprises an intermediate region bordered by the first transition area, the second transition area, the third transition area and the third LED, said intermediate region comprising a plurality of intermediate nanowires having a distribution of diameters so that all said intermediate nanowires emit at a plurality of wavelengths distributed over the entirety of the visible spectrum.

By wire or by nanowire, it should be understood a 3D structure with an elongate shape according to the longitudinal direction. The longitudinal direction of the 3D structure, according to z in the figures, is larger, and preferably quite larger, than the transverse dimensions of the 3D structure, in the plane xy in the figures. For example, the longitudinal dimension is at least five times, and preferably at least ten times, larger than the transverse dimensions.

By diameter, it should be understood the largest transverse dimension of the nanowire. In the present invention, the 3D structures do not necessarily have a circular cross-section. In particular, in the case of 3D structures based on GaN, this cross-section may be hexagonal. The diameter then corresponds to the distance separating two opposite vertices of the hexagonal cross-section. Alternatively, the diameter may correspond to a mean diameter calculated from the diameter of a circle inscribed in the polygon of the cross section and from the diameter of a circumscribed circle of this polygon.

The 3D structures may also have a hexagonal or polygonal cross-section.

In the present patent application, the terms "light-emitting diode", "LED" or simply "diode" are used as synonyms. A "LED" may also be understood as a "micro-LED".

Hereinafter, the following abbreviations relating to a material M are optionally used:

M-i refers to the intrinsic or unintentionally doped material M, according to the terminology commonly used in the microelectronics industry for the suffix-i.

M-n refers to the N, N+ or N++ doped material M, according to the terminology commonly used in the microelectronics industry for the suffix-n.

M-p refers to the P, P+ or P++ doped material M, according to the terminology commonly used in the microelectronics industry for the suffix-p.

By a substrate, a layer, a device, "based" on a material M, it should be understood a substrate, a layer, a device comprising this material M alone or this material M and possibly other materials, for example, alloy elements, impurities or doping elements. Thus a 3D structure based on gallium nitride (GaN) may for example comprise gallium nitride (GaN or GaN-i) or doped gallium nitride (GaN-p, GaN-n). An active region based on indium gallium nitride (InGaN) may for example comprise aluminium gallium nitride (AlGaN) or gallium nitride with various proportions of aluminium and indium (GaInAlN). In the context of the present invention, the material M is generally crystalline.

A reference frame, preferably orthonormal, comprising the axes x, y, z is represented in the appended figures.

The terms "substantially", "about", "in the range of" mean, when they relate to a value, "within 10%" of this value or, when they relate to an angular orientation, "within 10°" of this orientation. Thus a direction substantially normal to a plane means a direction having an angle of 90±10° with respect to the plane.

By "light beam having mainly a wavelength λ", it should be understood a beam whose spectrum peak wavelength is located at the wavelength λ. The spectrum of the beam typically follows a Gaussian distribution. The peak of the spectrum should then be understood as the maximum value of the Gaussian.

By "light beam emitted mainly according to a direction d", it should be understood a beam whose maximum light intensity is located in the axis defining the direction d.

To determine the geometry of the 3D structures and the compositions of the different elements (wire, active region, collar for example) of these 3D structures, it is possible to proceed with Scanning Electron Microscopy (SEM) or Transmission Electron Microscopy (TEM) or Scanning Transmission Electron Microscopy (STEM) analyses.

TEM or STEM lend themselves particularly well to observing and identifying quantum wells—the thickness of which is generally of the order of a few nanometres—in the active region. Different techniques listed hereinafter without limitation may be implemented: dark field and bright field imaging, weak beam imaging, HAADF (acronym for "High Angle Annular Dark Field") imaging.

The chemical compositions of the different elements may be determined using the well-known EDX or X-EDS method, the acronym for "energy dispersive x-ray spectroscopy".

This method is well-suited to analyse the composition of small-sized optoelectronic devices such as 3D LEDs. It can be used on metallurgical sections in scanning electron microscopy (SEM) or on thin slices in a transmission electron microscope (TEM).

The optical properties of the different elements, and in particular the main emission wavelengths of the axial 3D LEDs based on GaN and/or of the active regions based on InGaN, may be determined by spectroscopy.

Cathodoluminescence (CL) or photoluminescence (PL) spectroscopies are well adapted for optically characterising the 3D structures described in the present invention.

In particular, the above-mentioned techniques allow determining whether an optoelectronic device with an axial 3D structure in the form of a wire comprise InGaN-based quantum wells formed at the top of a GaN-based wire, and a masking layer indicating an implementation of a MOVPE-type deposition.

It should be noted that in the chromaticity diagrams shown in FIGS. 6a and 6b, the coordinates correspond to the trichromatic coordinates x and y typically defined by the standards of the CIE XYZ colorimetric system.

As illustrated in FIG. 3, the optoelectronic device 1 object of the invention typically comprises a substrate 2 extending according to the plane xy represented in FIGS. 1 to 5. The substrate has an upper face 20 extending, in turn, according to the first direction and the second direction. The substrate 2 may be in the form of a stack comprising, according to the direction z, a support 21, a superficial layer called nucleation layer 22 and a masking layer 23.

In particular, the substrate 21 may be made of sapphire to limit the mesh parameter discrepancy with GaN, or of silicon to reduce costs and for technological compatibility problems. In the latter case, it might be in the form of a wafer with a diameter of 200 mm or 300 mm. In particular, it serves as a support to the 3D structures.

For example, the nucleation layer 22 is based on AlN. Alternatively, it may be based on metal nitrides, for example GaN or AlGaN. It may be formed over the support 21 made of silicon by epitaxy, preferably by MOVPE (acronym for "MetalOrganic Vapour Phase Epitaxy"). In a known manner, one or more intermediate buffer layer(s) may be disposed between the nucleation layer 22 and the support 21. According to one example, the nucleation layer 22 has a thickness of between 1 nm and 10 nm. It preferably has a thickness of the order of a few hundreds of nanometres, for example approximately 100 nm or 200 nm, to a few microns, example of the order of 2 μm. This may also have a thickness of less than 100 nm. Such a thickness allows limiting the apparition of structural defects in the nucleation layer 22. In particular, the growth of this nucleation layer 22 may be pseudomorphic, i.e. the epitaxy stresses (related in particular to the difference in mesh parameters between Si and AlN, GaN or AlGaN) may be elastically relieved during the growth. Thus, the crystalline quality of this nucleation layer 22 may be optimised.

Preferably, the masking layer 23 is made of a dielectric material, for example of silicon nitride Si3N4. It can be deposited by Chemical-Vapour Deposition CVD over the nucleation layer 22. It partially masks the nucleation layer 22 and comprises openings preferably circular exposing areas of the nucleation layer 22. These openings typically have different dimensions, for example different diameters, depending on the considered areas, in particular the areas corresponding to the first LED and/or to the first transition area and/or to the second LED and/or to the second transition area, etc. The openings may be evenly distributed within each area, for example in the form of an ordered area. Different steps d, i.e. the distance separating the centres of two adjacent openings 120, may be defined according to said areas. For example, these openings may be made by UV or DUV lithography (acronym for "Deep UV"), by electron beam lithography or by NIL (acronym for NanoInprint Lithography). Such a masking layer 23 enables a localised growth of a 3D structure such as a nanowire from the nucleation layer 22 and at each opening. The lower portion of the 3D structure then bears on the nucleation layer of the substrate 2 through its base.

In addition, the optoelectronic device 1 comprises a first LED 100 disposed over the upper face 20 of the substrate 2 and extending itself in the plane xy. This first LED 100 typically comprises at least one active nanowire 101. Advantageously, such a nanowire 101 extends from the possible nucleation layer 22 and through an opening of the possible masking layer 23 of the substrate 2. Advantageously, the first LED 100 comprises a plurality of first active nanowires 101, as shown in FIGS. 1 to 5.

The first nanowires 101 have first diameters having a value substantially equal to a target value called first target diameter $\varphi_{10}$. It should be understood that, due to inaccuracies resulting from the manufacturing processes, the first nanowires 101 can hardly all have a diameter equal to the first target diameter $\varphi_{10}$. Hence, for each first nanowire, a first real diameter denoted $\varphi_{1,n}$ is defined, n indexing the first nanowires and therefore varying from 1 to $N_1$, $N_1$ being the number of first nanowires 101. Preferably, this first real diameter is such that $0.9 \cdot \varphi_{10} < \varphi_{1,n} < 1.1 \cdot \varphi_{10}$. Indeed, the variations of the value of the diameter of nanowires due to manufacturing bias may be estimated to about 10% of the target value.

A first active nanowire 101 comprises an active region 102 and is typically electrically connected. This active region 102 is the site of radiative recombinations of electron-hole pairs allowing obtaining a light radiation having a main wavelength. The active region 102 typically comprises a plurality of quantum wells, for example formed by emissive layers based on GaN, InN, InGaN, AlGaN, AlN, AlInGaN, GaP, AlGaP, AlInGap, AlGaAs, GaAs, InGaAs, AlIlAs, or a combination of several ones of these materials.

Preferably, all of the first active nanowires 101 of the first LED 100 form a photonic crystal which could be described by several parameters and in particular:
the emission wavelength,
the array step,
the filling ratio, also called aperture ratio or density, generally comprised between 10 and 90%,
the mesh type (hexagonal, square . . . ),
the refractive index of the material filling the spaces between the nanowires 101, commonly called "filler", preferably comprised between 1 and 1.7, and
the dimensions of the nanowires.

A crystal is typically characterised by the ratio between the array step, commonly referred to as "pitch", and the emission wavelength.

As illustrated in FIG. 8, the first nanowires 101 are advantageously disposed according to rows directed according to a first direction and/or a second direction. These rows are called first rows and first secondary rows respectively. In the figures, the first direction and the second direction respectively correspond to the directions x and y of the orthonormal reference frame. Thus, in the figures, the first direction and the second direction are normal. However, it could be considered that they are not so. The first rows and the first secondary rows are respectively $N_{LED,x,1}$ and $N_{LED,y,1}$ in number. Moreover, they are designated using an indexing ranging from 1 to $N_{LED,x,1}$ and from 1 to $N_{LED,y,1}$ respectively.

Advantageously, all of these rows and therefore of the first nanowires 101 form a regular two-dimensional array. For example, it may consist of a monoclinic array, an orthorhombic array, a tetragonal array or a hexagonal array.

Advantageously, the first rows are separated by first distances considered according to the first direction having a value substantially equal to a first target distance $p_{10,x}$. It should be understood that due to inaccuracies resulting from the manufacturing processes, the distance between two neighbouring first rows may vary around the first target distance $p_{10,x}$. The variations of the value of the distance between two neighbouring first rows due to manufacturing bias may be estimated at about 10% of the target value.

The first LED 100 typically comprises a layer based on a transparent conductive oxide, commonly denoted TCO (standing for "Transparent Conductive Oxide"), whose thickness is preferably comprised between 100 and 300 nm. The nanowires may be disposed, according to the longitudinal direction, between a mirror layer based on a metal material, typically Al, and the TCO layer. This arrangement of the nanowires between the mirror layer and the TCO layer possibly allows creating a Fabry-Perot cavity in the longitudinal direction.

Advantageously, the first LED 100 is sized so as to have dimensions in the same range as those of a subpixel of a display device.

The first LED 100 is configured to emit a first light beam 110. Advantageously, the first light beam 110 is configured to be emitted mainly according to a direction normal to the substrate 2, namely extending parallel to the axis z shown in FIGS. 1 to 5, called longitudinal direction. However, the light beam 110 comprises a plurality of rays propagating according to as many emission directions. For example, the emission is omnidirectional. According to another embodiment, the rays of the beam are typically emitted according to a Lambertian or orthotropic profile, i.e. the luminance of the LED 100 is angularly uniform, but the emitted light intensity depends on the emission direction. The light intensity of the beam typically varies according to Lambert's law:

$$I = I_0 \cos(\theta)$$

with I the light intensity according to an emission direction, $I_0$ the light intensity at the source and $\theta$ the angle of the emission direction with respect to the normal to the source surface, herein the longitudinal direction. It should be understood that any other emission profile could be considered and that the first LED 100 is not limited to a Lambertian source.

In addition, the device 1 comprises a first transition area 1000 bordering at least partially the first LED 100.

The first transition area 1000 includes a plurality of first transition nanowires 1001 extending in the transverse direction from the upper face 20 of the substrate 2.

The first transition nanowires 1001 may be active or passive depending on the use that one wish to do thereof. By "passive nanowire", it should be understood a nanowire emitting no light radiation. A passive nanowire is typically similar to an active nanowire but is not electrically connected.

Preferably, the first transition nanowires 1001 form a photonic crystal extending over the substrate 2. The parameters allowing describing this photonic crystal are the same as those describing the photonic crystal formed by the active nanowires 102 (array step, mesh type, filling ratio . . . ), except for the emission length which is not herein defined when the first transition nanowires are passive.

Advantageously, the first transition nanowires 1001 are disposed according to rows directed according to the first direction x and/or the second direction y. These rows are called first transition rows and first secondary transition rows and they are $N_{trans,x,1}$ and $N_{trans,y,1}$ in number respectively. Moreover, they are designated using an indexing ranging from 1 to $N_{LED,x,1}$ when getting away from the first LED 100 and from 1 to $N_{LED,y,1}$ respectively.

Advantageously, all of the first transition nanowires 1001 form a regular two-dimensional array, preferably of the same type as all of the first nanowires 101. This allows optimising the manufacture of the first LED 100 and of the first transition area 1000, which is advantageously done simultaneously.

It is provided for the presence of a transition sub-area 1100 bordering the first LED 100 and formed by $N_{sub-trans,1}$ first transition rows, $N_{sub-trans,1}$ being comprised between 2 and $N_{trans,x,1}$. The first transition nanowires 1001 of the first transition sub-area 1100 are particular in that they have diameters called first transition diameters and/or distances between first consecutive transition rows varying when getting away from the first LED 100. This particularity allows avoiding an abrupt change in the diameter and/or the distance between the nanowires at the boundary of the first LED. This allows avoiding the edge effects affecting the efficiency of the first LED 100.

Indeed, the variations of the value of the first transition diameters of the first transition nanowires 1001 or of the value of the distance between two consecutive rows of first transition nanowires when getting away from the first LED 100 is fundamental.

These variations within the first transition sub-area 1100 may accommodate different progression laws when getting away from the first LED 100. The diameter variations and the variations relating to the distance between two consecutive first transition rows may accommodate similar or distinct progression laws. For example, these variations may be steady and possibly strictly steady, i.e. increasing or decreasing and possibly strictly increasing or strictly decreasing. In addition, the variation of these parameters may be linear. Furthermore, it is not excluded that one of the two parameters has an increasing or decreasing variation when getting away from the first LED, and vice versa. Indeed, the diameter and/or the distance between two consecutive rows may increase in some regions of the first transition sub-area 1100 and decrease in other regions of the first transition sub-area 1100, depending on the targeted applications. Advantageously, it is provided for the first transition nanowires 1001 forming the first transition rows immediately bordering the first LED 100 to have first transition diameters steadily varying over several rows, for example 3 to 5 rows. In the same manner, it is advantageously provided for the distance between two consecutive first transition rows to steadily vary over several first transition rows immediately bordering the first LED, for example 3 to 5 rows. By "first transition rows immediately bordering the first LED", the first transition rows that are encountered at first when getting away from the first LED 100 according to the first direction x. In other words, the first transition nanowires 1001 have the smallest distance according to x to the LED 100, or the lowest index.

Regardless of the law governing the variations of the diameters of the first transition nanowires and the distances between first transition rows within the first transition sub-area 1100, to avoid any abrupt transition of the first transition diameter and/or the distance between two consecutive rows when getting away from the first LED 100, it is provided for these variations to be bound. In particular, it is provided for the diameter of the transition nanowires 1001 of two consecutive rows to increase or decrease only by 3% to 13% with respect to the row preceding it when getting away from the first LED 100.

In turn, the step between two consecutive rows when getting away from the first LED 100 can increase or decrease only by 2% to 4% with respect to the step preceding it. In order to avoid any abrupt transition between the first LED 100 and the first transition area 1000, it is also provided for the first transition nanowires 1001 immediately bordering the first LED 100 to have a diameter close to the target diameter of the first nanowires 101 of the first LED 100. Their diameter typically varies within a proportion lower than 5% of $\varphi_{10}$.

For the same purpose, any abrupt transition of the distance between the nanowires at the interface between the first LED 100 and the first transition area 1000 is prevented. To do so, a first interface distance $d_{interface,1}$ is defined separating the first row bordering the first transition area 1000 (first row No. $N_{LED,x,1}$) and the first transition row bordering the first LED 100 (first transition row No. 1). The value of the first interface distance $d_{interface,1}$ and that of the distance according to the first direction x between the first transition row No. 1 and the first transition row No. 2 vary within a proportion comprised between 2% and 4% of the distance according to the first direction x between the first row No. $N_{LED,1}-1$ and the first row No. $N_{LED,1}$, and the first interface distance $d_{interface,1}$ respectively.

It could also be considered that the first transition area 1000 comprises a sub-area bordering the first transition sub-area, called threshold sub-area, in which at least one of the two parameters amongst the diameter of the first transition nanowires 1001 and the distance between the neighbouring first transition rows remains constant when getting away from the first LED 100.

The electric power supply of a set of active nanowires is typically done in parallel. Indeed, the active nanowires of the same set are conventionally connected in parallel to an upper electrode and a lower electrode arranged beneath the substrate 2 from which said active nanowires extend.

In the context of the invention, it is advantageously provided for the first nanowires 101 of the first LED 100 and the first transition nanowires 1001 of the first transition area 1000 to be powered separately, by distinct electrodes. In particular, such a separation allows controlling which nanowires are powered and consequently which areas are emitting. This feature is advantageous in the application of the present invention relating to the extension of the gamut of the device described later on. However, it is not excluded that the first nanowires 101 of the first LED 100 and the first transition nanowires 1001 of the first transition area 1000 are powered simultaneously by the same electrode.

According to an advantageous embodiment illustrated in FIG. 2, the optoelectronic device 1 comprises a second LED 200 disposed over the upper face of the substrate 2 and adjacent to the first LED 100. The two LEDs 100, 200 may be assimilated to two adjacent subpixels of a display screen.

The second LED 200 is configured to emit a second light beam 210 advantageously configured, like the first light beam 110, to be emitted mainly according to the transverse direction. For example, the second light beam 210 is omnidirectional and typically features a Lambertian profile.

The second light source 200 comprises at least one second active nanowire 201 extending from the upper face 20 of the substrate 2, and preferably a plurality of second active nanowires 201. Preferably, the second active nanowires 201 form a photonic crystal which could be described in the same manner as the photonic crystal formed by the first active nanowires 101. Advantageously, the second nanowires 201 are disposed according to rows directed according to a first direction and/or a second direction. These rows are referred to as second rows and second secondary rows respectively. The second rows and the second secondary rows are respectively $N_{LED,x,2}$ and $N_{LED,y,2}$ in number. Moreover, they are designated using an indexing ranging from 1 to $N_{LED,x,2}$ when getting away from the first transition area and from 1 to $N_{LED,y,2}$ respectively. Advantageously, the second rows are separated by second distances considered according to the first direction having a value substantially equal to a second target distance $p_{20,x}$. It should be understood that due to inaccuracies resulting from the manufacturing processes, the distance between two neighbouring second rows may vary around the second target distance $p_{20,x}$. The variations of the value of the distance between two neighbouring second rows due to manufacturing bias may be estimated to about 10% of the target value.

Like for the first nanowires 101, for each second nanowire 201, a second real diameter denoted $\varphi_{2,n}$ is defined, n indexing the second nanowires and therefore varying from 1 to $N_2$, $N_2$ being the number of first nanowires 101. Preferably, this first real diameter is such that $0.9 \cdot \varphi_{20} < \varphi_{2,n} < 1.1 \cdot \varphi_{20}$. $\varphi_{20}$ being a second target diameter.

The transition area 1000 separates the first LED 100 and the second LED 200. Several configurations of the transition area could be considered. For example, it is possible to provide, within the transition area, and therefore separating the first LED 100 and the second LED 200:
- the first transition sub-area 1100 as described before bordering the first LED 100,
- possibly a second transition sub-area 1200 bordering the second LED 200,
- possibly a threshold sub-area as described before and separating the first transition sub-area 1100 and the second transition sub-area 1200.

The characteristics of the first transition sub-area 1100 apply mutatis mutandis to the second transition sub-area 1200.

Advantageously, the first transition diameters and/or the distances between neighbouring first transition rows progressively vary:
- from the target value of the first diameters, $\varphi_{10}$, of the first nanowires 101 of the first LED 100, to the target value of the second diameters, $\varphi_{20}$, of the second nanowires 201 of the second LED 200, the values $\varphi_{10}$ and $\varphi_{20}$ being taken on by the diameters of the transition nanowires 1001 of the first transition rows No. 1 and $N_{trans,x,1}$ respectively, and/or
- from the first target distance, $p_{10,x}$, to the second target distance, $p_{20,x}$, the values $p_{10,x}$ and $p_{20,x}$ being respectively considered between the first transition row No. 1 and the first transition row No. 2 on the one hand and the first transition row No. $N_{trans,x,1}-1$ and the first transition row No. $N_{trans,x,1}$ on the other hand, respectively.

For example, FIG. 2 illustrates the case where the diameter of the transition nanowires 1001 varies from $\varphi_{10}$ to $\varphi_{20}$ when scrolling the transition area 1000 from the first LED 100 to the second LED 200.

In particular, FIG. 3 illustrates the case where the distance between two successive first transition rows vary from $p_{10,x}$ to $p_{20,x}$, when scrolling the transition area 1000 from the first LED 100 to the second LED 200.

This variation, preferably continuous and possibly steady, forms a smooth transition between the first and second LEDs 100, 200. This allows avoiding symmetry discontinuities between the different arrays of nanowires forming the first and second LEDs 100, 200. Thus, the edge effects are advantageously limited or suppressed.

Preferably, this variation of the first transition diameters and/or of the distances between neighbouring first transition rows is linear.

The previously-described embodiments, wherein the device 1 comprises a transition area and respectively one or two LED(s), may apply to devices comprising a larger number of LEDs and transition areas. A device with three LEDs 100, 200, 300 and two transition areas 1000, 2000, respectively separating the first and second LEDs 100, 200 on the one hand and the second and third LEDs 200, 300 on the other hand, is for example illustrated in FIG. 5. According to one possibility, the device comprises three LEDs 100, 200, 300 and three transition areas 1000, 2000, 3000, the first transition area 1000 separating the first and second LEDs 100, 200, the second transition area 2000 separating the second and third LEDs and the third transition area 3000 separating the third and first LEDs. In particular, this embodiment allows making RGB pixels formed by three subpixels R, G, B, corresponding to the three LEDs 100, 200, 300, respectively emitting in red (R denoting "red"), green (G denoting "green") and blue (B denoting "blue").

It could also be considered that the device 1 comprises four LEDs 100, 200, 300, 400 separated by four transition areas 1000, 2000, 3000, 4000 as shown in FIG. 4b.

The characteristics of the first and second LEDs 100, 200 described before apply mutatis mutandis to the third and fourth LEDs 300, 400. As illustrated in FIG. 4b, these typically comprise respectively third nanowires 301 and fourth nanowires 401 respectively having a third target diameter (30 and a fourth target diameter (40 and organised into rows directed according to the second direction. In turn, these rows are typically spaced apart according to the first direction by a third target distance $p_{30,x}$ and a fourth target distance $p_{40,x}$s, respectively.

The characteristics of the first transition area 1000 described before apply mutatis mutandis to the three transition areas 2000, 3000, 4000.

According to an advantageous embodiment of the present invention, at least one portion of the nanowires of the transition area(s) are active nanowires and are used to extend the range of colours that could be rendered by the device 1.

The figures, and in particular FIGS. 6a, 6b and 7, illustrate this embodiment applied to a device with four LEDs emitting three native colours (C1, C2 and C3), but it should be understood that this principle could be applied to any device comprising more than two LEDs.

The colours commonly emitted by the subpixels of the same pixel are red (C1 in the chromaticity diagram illustrated in FIG. 6a), green (C2 in the chromaticity diagram) and blue (C3 in the chromaticity diagram). However, other colours may be rendered from such a pixel. All colours comprised in the gamut 4 defined by the colours emitted by the three subpixels on the chromaticity diagram of the CIE XYZ colorimetric system may be obtained by linear combinations of the three native colours. For example, by shutting down the subpixel emitting in blue and by linear combination of the red and green beams, it is possible to ensure that the colour perceived by an observer is yellow. However, all tones of the locus spectrum, i.e. all pure colours perceptible by the human eye, are not included in the gamut 4 characterising the tones that could be generated by the pixel. Yet, some tones located outside the gamut 4 could be necessary to faithfully render an image. Advantageously, the transition areas may be used to reach these tones of the locus spectrum 3 located outside the gamut 4.

Indeed, the parameters characterising all of the transition nanowires of a transition area separating two LEDs may be configured so that this area emits a beam whose wavelength is located outside the gamut 4. Amongst these parameters, there is in particular the diameter of each of the transition nanowires.

For example, it could be considered that, over several consecutive rows, the transition nanowires 1001 are all configured to emit a beam at the same wavelength called transition wavelength $\lambda_{trans}$, distinct from the wavelengths emitted by said adjacent LEDs. The wavelength of the overall beam obtained by the superimposition of the beams emitted by each of these transition nanowires 1001 is then $\lambda_{trans}$ too.

According to another embodiment, it is provided for the total beam at the wavelength $\lambda_{trans}$ located outside the gamut 4 to be generated by a set of transition nanowires 1001. Indeed, this is made possible by an averaging effect of the individual beams generated by each of the involved transition nanowires 1001. Moreover, these transition nanowires 1001 may, quite possibly, have parameters (step, diameters) varying progressively, as described before.

In any case, the transition wavelength $\lambda_{trans}$ is selected so as to be advantageous in the context of image display.

As mentioned before, the first nanowires 101 of the first LED 100 and the first transition nanowires 1001 of the first transition area 1000 are advantageously electrically powered independently of each other, by distinct electrodes. This allows powering only the first transition nanowires 1001. The device 1 can then emit only the colour corresponding to said transition area. The possibility of isolating this colour may be particularly advantageous for rendering some images.

According to an advantageous embodiment, it is provide for all of the first transition nanowires of a threshold sub-area as described hereinabove and separating a first LED 100 and a second LED 200 to be configured to emit a wavelength $\lambda_{trans}$ distinct from $\lambda_1$ and $\lambda_2$.

According to a particularly advantageous embodiment represented in FIG. 7, the device 1 comprises an intermediate region 500 comprising a plurality of intermediate nanowires 501 configured so that the intermediate region emits a white light beam. This embodiment is quite particularly suited to devices 1 comprising three or four LEDs separated in pairs by transition areas. As represented in FIG. 7, in this example, the intermediate region 500 is bordered by the first, second and third transition areas 1000, 2000, 3000 as well as the third LED 300. In particular, the intermediate nanowires 501 have a variety of diameters allowing emitting at a plurality of wavelengths distributed substantially over the entirety of the visible spectrum. Thus, the intermediate region 500 advantageously generates a substantially white light beam by an averaging effect. In addition, the diameters of the intermediate nanowires 501 immediately bordering each of the transition areas 1000, 2000, 3000 are selected so as to avoid any abrupt transition, according to the model of a transition area as described before. It should be noted that sizing of the array of nanowires of the intermediate region 500 (step, diameter), should take account of the value of the current injected in each of the intermediate nanowires. Indeed, the light power emitted by these intermediate nanowires 501 depends on this current, and even at constant current, it is not equal from one nanowire to another when these emit at different wavelengths. Hence, sizing the intermediate nanowires 501 should be done accordingly: obtaining a white light depends on the number of intermediate nanowires 501 emitting at each wavelength and on the power emitted by each of them. Typically, the intermediate region 500 is powered by one single electrode: the injected current is then identical for each of the intermediate nanowires 501. However, it could be considered that several electrodes are provided to power different sets of intermediate nanowires 501. This allows adjusting more accurately sizing of the intermediate nanowires 501 and facilitating the obtainment of a white light.

It should be understood that this embodiment applies to any device according to the invention comprising a number of LEDs greater than three.

Throughout the different embodiments described hereinabove, it clearly arises that the invention provides an effective solution to the problems due to the edge effects around the pixels and subpixels of display screens, as well as the current limitations of the gamut of these same screens.

However, the invention is not limited to the previously-described embodiments.

In particular, the number, the shape and the arrangement of each element of the device may be adapted according to the display needs.

The invention claimed is:

1. An optoelectronic device comprising at least:
 a first LED extending mainly in a plane defined by a first direction and a second direction, said first LED comprising a plurality of first nanowires having first diameters having a value substantially equal to a first target diameter $\varphi_{10}$ and organised into $N_{LED,x,1}$ rows directed according to the second direction, called first rows, said first rows being separated by first distances considered according to the first direction having a value substantially equal to a first target distance $p_{10,x}$, said first LED being configured to emit a first light beam having mainly a first wavelength $\lambda_1$, and
 a first transition area extending mainly in the plane and bordering at least partially said first LED, said first transition area comprising a plurality of first transition nanowires having first transition diameters and organised into $N_{trans,x,1}$ rows directed according to the second direction, called first transition rows and indexed according to numbering from 1 to $N_{trans,x,1}$ when getting away from the first LED according to the first direction, the first rows being indexed according to numbering from 1 to $N_{LED,x,1}$ according to the first direction when getting close to the first transition area,
wherein
 the first transition area comprises a first transition sub-area formed by the $N_{sub-trans,1}$ first transition rows, with $2 \leq N_{sub-trans,1} \leq N_{trans,x,1}$, the first transition sub-area bordering the first LED, and in the first transition sub-area:
  the first transition nanowires are such that:
    i. the value of the first transition diameters of the first transition nanowires of the first transition row No. 1 varies within a proportion lower than 5% of the first target diameter $\varphi_{10}$, and
    ii. the value of the first transition diameter of each first transition nanowire of any first transition row No. i, i being comprised between 2 and $N_{sub\text{-}trans,1}$, varies within a proportion comprised between 3% and 13% of the value of the first transition diameter of the first transition nanowire of the first transition row No. i−1 the closest thereto, or
  the first transition nanowires are such that:
    i. the first row No. $N_{LED,x,1}$ and the first transition row No. 1 being separated according to the first direction x by a first interface distance $d_{interface,1}$, the first interface distance $d_{interface,1}$ and the distance according to the first direction between the first transition row No. 1 and the first transition row No. 2 vary within a proportion comprised between 2% and 4% of the distance according to the first direction between the first row No. $N_{LED,x,1}-1$ and the first row No. $N_{LED,x,1}$ and the first interface distance $d_{interface,1}$ respectively, and
    ii. the distance according to the first direction between any first transition row No. i and the first transition row No. i+1 varies within a proportion comprised between 2% and 4% of the distance according to the first direction between the first transition row No. i−1 and the first transition row No. i, i being comprised between 2 and $N_{sub\text{-}trans,1}-1$.

2. The optoelectronic device according to claim 1, wherein the first transition diameters of the first transition nanowires of a same first transition row are equal.

3. The optoelectronic device according to claim 1, wherein:
  the value of the first transition diameters of the first transition nanowires of the first transition rows has a strictly increasing or strictly decreasing variation over at least three successive first transition rows when getting away from the first LED, and/or
  the distance between two successive first transition rows when getting away from the first LED has a strictly increasing or strictly decreasing variation over at least three successive first transition rows when getting away from the first LED.

4. The optoelectronic device according to claim 3, wherein:
  the value of the first transition diameters of the first transition nanowires of the first transition rows has a linear variation over at least three successive first transition rows when getting away from the first LED, and/or
  the distance between two successive first transition rows when getting away from the first LED has a linear variation over at least three successive first transition rows when getting away from the first LED.

5. The optoelectronic device according to claim 4, wherein the first nanowires and the first transition nanowires are further organised into rows according to the first direction.

6. The optoelectronic device according to claim 1, wherein the first direction and the second direction are orthogonal.

7. The optoelectronic device according to claim 1, wherein the first transition sub-area extends over at least three rows of first transition nanowires.

8. The optoelectronic device according to claim 1, wherein the first transition sub-area has a surface $S_{1000}$ and the first LED has a surface $S_{100}$ such that $S_{100}/5 < S_{1000} < S_{100}/2$.

9. The optoelectronic device according to claim 1, wherein the first nanowires on one hand and the first transition nanowires on another hand are powered by distinct electrical contacts.

10. The optoelectronic device according to claim 1, further comprising:
  a second LED extending mainly in the plane, said second LED comprising a plurality of second nanowires having second diameters having a value substantially equal to a second target diameter $\varphi_{20}$ and organised into $N_{LED,x,2}$ rows directed according to the second direction, called second rows, and indexed according to numbering from 1 to $N_{LED,x,2}$ when getting away from the first transition area according to the first direction, said second rows being separated by first distances considered according to the first direction having a value substantially equal to a second target distance $p_{20,x}$, said second LED being configured to emit a second light beam having mainly a second wavelength $\lambda_2$,
said first and second LEDs being separated at least by the first transition area.

11. The optoelectronic device according to claim 10, wherein $N_{sub\text{-}trans,1} = N_{trans,x,1}$ and wherein:
  the value of the first transition diameters of the first transition nanowires of the first transition row No. $N_{sub\text{-}trans,1}$ varies within a proportion lower than 5% of the second target diameter $\varphi_{20}$, and/or
  the second row No. 1 and the first transition row No. $N_{sub\text{-}trans,1}$ being separated according to the first diameter of a second interface distance $d_{interface,2}$,
  the distance according to the first direction between the first transition row No. $N_{sub\text{-}trans,1}$ and the first transition row No. $N_{sub\text{-}trans,1}-1$ varies within a proportion comprised between 2% and 4% of the second interface distance $d_{interface,2}$.

12. The optoelectronic device according to claim 10, wherein
  the first transition area comprises a second transition sub-area formed by the first transition rows No. $N_{sub\text{-}trans,2}$ to $N_{trans,x,1}$, with $N_{sub\text{-}trans,1} \leq N_{sub\text{-}trans,2} < N_{trans,x,1}$, and
  in the second transition sub-area:
    the first transition nanowires are such that:
      i. the value of the first transition diameters of the first transition nanowires of the first transition row No. $N_{trans,x,1}$ varies within a proportion lower than 5% of the second target diameter $\varphi 20$, and
      ii. the value of the first transition diameters of the first transition nanowires of any first transition row No. i, i being comprised between $N_{sub\text{-}trans,2}$ and $N_{trans,x,1}-1$, varies within a proportion comprised between 3% and 13% of the value of the first transition diameters of the first transition nanowire of the first transition row No. i+1,
    and/or
    the first transition nanowires are such that:
      i. the second row No. 1 and the first transition row No. $N_{trans,x,1}$ being separated according to the first direction x by a second interface distance $d_{interface,2}$, the distance according to the first direction between the first transition row No. $N_{trans,x,1}$ and the first transition row No. $N_{trans,x,1}-1$ and the second interface distance $d_{interface,2}$ vary within a proportion comprised between 2% and 4% of the second interface distance $d_{interface,2}$ and of the distance according to the first direction between the second row No. 1 and the second row No. 2 respectively, and ii. the distance according to the first direction between any first transition row No. i and the first transition row No. i−1 varies within a proportion comprised between 2% and 4% of the distance according to the first direction between the first transition row No. i and the first transition row No. i+1, i being comprised between $N_{trans,x,1}-1$ and $N_{sub-trans,2}+1$.

13. The optoelectronic device according to claim 12, wherein:
the value of the first transition diameters of the first transition nanowires of the first transition rows has a strictly increasing or strictly decreasing variation over at least three successive first transition rows when getting away from the second LED, and/or
the distance between two successive first transition rows when getting away from the first LED has a strictly increasing or strictly decreasing variation over at least three successive first transition rows when getting away from the second LED.

14. The optoelectronic device according to claim 13, wherein:
the value of the first transition diameters of the first transition nanowires of the first transition rows has a linear variation over at least three successive first transition rows when getting away from the second LED, and/or
the distance between two successive first transition rows when getting away from the first LED has a linear variation over at least three successive first transition rows when getting away from the second LED.

15. The optoelectronic device according to claim 11, wherein $N_{sub-trans,1}<N_{sub-trans,2}$ and wherein:
the distance between the first transitions rows No. $N_{sub-trans,1}$ to No. $N_{threshold,1}$ with $N_{sub-trans,1}<N_{threshold,1}\leq N_{sub-trans,2}$ is constant, and/or
the first transition diameters of the first transition nanowires of the first transition rows No. $N_{sub-trans,1}$ to No. $N_{threshold,1}$, with $N_{sub-trans,1}<N_{threshold,1}\leq N_{sub-trans,2}$ are constant,
thus forming a sub-area called first threshold sub-area.

16. The optoelectronic device according to any claim 1, wherein at least some of the first transition nanowires comprise an active region configured to emit a first transition light beam.

17. The optoelectronic device according to claim 16, wherein the first transition light beam has mainly a first transition wavelength $\Delta_{trans,1}$, with $\lambda_{trans,1}\neq\lambda_1$ and $\lambda_{trans,1}\neq\lambda_2$.

18. The optoelectronic device according to claim 10, wherein:
the first nanowires are organised into $N_{LED,y,1}$ rows directed according to the first direction, called first secondary rows, indexed according to numbering from 1 to $N_{LED,y,1}$ and separated by first secondary distances considered according to the second direction having a value substantially equal to a first target secondary distance $p_{10,y}$, and
the second nanowires are organised into $N_{LED,y,2}$ rows directed according to the first direction, called second secondary rows and indexed according to numbering from 1 to $N_{LED,y,2}$ and separated by second secondary distances considered according to the second direction having a value substantially equal to a second target secondary distance $p_{20,y}$.

19. The optoelectronic device according to claim 18, further comprising:
a third LED extending mainly in the plane, said third LED comprising a plurality of third nanowires having third diameters having a value substantially equal to a third target diameter $\varphi_{30}$ and organised into $N_{LED,x,3}$ rows directed according to the second direction, called third rows and into $N_{LED,y,3}$ rows directed according to the first direction, called third secondary rows, said third LED being configured to emit a third light beam having mainly a third wavelength $\lambda_3$,
a second transition area extending mainly in the plane and bordering at least partially said second LED and said third LED, said second transition area comprising a plurality of second transition nanowires having second transition diameters and organised into $N_{trans,y,2}$ rows directed according to the first direction, called second secondary transition rows and indexed according to numbering from 1 to $N_{trans,y,2}$ when getting close to the second LED according to the second direction,
a third transition area extending mainly in the plane and bordering at least partially said third LED and said first LED, said third transition area comprising a plurality of third transition nanowires having third transition diameters and organised into $N_{trans,y,3}$ rows directed according to the first direction, called third secondary transition rows and indexed according to numbering from 1 to $N_{trans,y,3}$ when getting close to the first LED according to the second direction,
said second and third LEDs being separated by the second transition area, said third and first LEDs being separated by the third transition area, wherein the second nanowires of the second transition area are such that:
i. the value of the second transition diameters of the second transition nanowires of the second transition row No. 1 varies within a proportion lower than 5% of the third target diameter $\varphi_{30}$, and
ii. the value of the second transition diameter of each second transition nanowire of any second transition row No. i, i being comprised between 2 and $N_{trans,y,2}$, varies within a proportion comprised between 3% and 13% of the value of the second transition diameter of the second transition nanowire of the second transition row No. i−1 the closest thereto, and
iii. the value of the second transition diameters of the second transition nanowires of the second transition row No. $N_{trans,y,2}$ varies within a proportion lower than 5% of the second target diameter $\varphi_{20}$,
and/or
i. the second secondary row No. 1 and the second secondary transition row No. $N_{trans,y,2}$ being separated according to the second direction by a third interface distance $d_{interface,3}$, the third interface distance $d_{interface,3}$ and the distance according to the second direction between the second secondary transition row No. $N_{trans,y,2}$ and the second secondary transition row No. $N_{trans,y,2}-1$ vary within a proportion comprised between 2% and 4% of the distance according to the second direction between the second secondary transition row No. $N_{trans,y,2}$ and the second secondary transition row No. $N_{trans,y,2}-1$ and the third interface distance $d_{interface,3}$ respectively, ii. the distance according to the second direction between any second secondary transition row No. i and the second secondary transition row No. i+1 varies within a proportion comprised between 2% and 4% of the distance according to the second direction between the second secondary transition row No. i−1 and the second secondary transition row No. i, i being comprised between 2 and $N_{trans,y,2}-1$, and iii. the third secondary row No. $N_{LED,y,3}$ and the second secondary transition row No. 1 being separated according to the second direction by a fourth interface distance $d_{interface,4}$, the fourth interface distance $d_{interface,4}$ and the distance according to the second direction between the second secondary transition row No. 2 and the second secondary transition row No. 1 vary within a proportion comprised between 2% and 4% of the distance according to the second direction between the third secondary row No. $N_{LED,y,3}$ and the third secondary row No. $N_{LED,y,3}-1$ and the fourth interface distance $d_{interface,4}$ respectively, and wherein the third nanowires of the third transition area are such that:

i. the value of the third transition diameters of the third transition nanowires of the third transition row No. 1 varies within a proportion lower than 5% of the third target diameter $\varphi_{30}$, and ii. the value of the third transition diameter of each third transition nanowire of any third transition row No. i, i being comprised between 2 and $N_{trans,y,3}$, varies within a proportion comprised between 3% and 13% of the value of the third transition diameter of the third transition nanowire of the third transition row No. i−1 the closest thereto, and iii. the value of the third transition diameters of the third transition nanowires of the third transition row No. $N_{trans,y,3}$ varies within a proportion lower than 5% of the first target diameter $\varphi_{10}$, and/or i. the first secondary row No. 1 and the third secondary transition row No. $N_{trans,y,3}$ being separated according to the second direction by a sixth interface distance $d_{interface,6}$, the sixth interface distance $d_{interface,6}$ and the distance according to the second direction between the third secondary transition row No. $N_{trans,y,3}$ and the third secondary transition row No. $N_{trans,y,3}-1$ vary within a proportion comprised between 2% and 4% of the distance according to the second direction between the third secondary transition row No. $N_{trans,y,3}$ and the third secondary transition row No. $N_{trans,y,3}-1$ and the sixth interface distance $d_{interface,3}$ respectively, ii. the distance according to the second direction between any third secondary transition row No. i and the third secondary transition row No. i+1 varies within a proportion comprised between 2% and 4% of the distance according to the second direction between the third secondary transition row No. i−1 and the third secondary transition row No. i, i being comprised between 2 and $N_{trans,y,3}-1$, and iii. the third secondary row No. $N_{LED,y,3}$ and the third secondary transition row No. 1 being separated according to the second direction by a fifth interface distance $d_{interface,5}$, the fifth interface distance $d_{interface,5}$ and the distance according to the second direction between the third secondary transition row No. 2 and the third secondary transition row No. 1 vary within a proportion comprised between 2% and 4% of the distance according to the second direction between the third secondary row No. $N_{LED,y,3}$ and the third secondary row No. $N_{LED,y,3}-1$ and the fourth interface distance $d_{interface,4}$ respectively.

20. The optoelectronic device according to claim 19, further comprising an intermediate region bordered by the first transition area, the second transition area, the third transition area and the third LED, said intermediate region comprising a plurality of intermediate nanowires having a distribution of diameters so that all said intermediate nanowires emit at a plurality of wavelengths distributed over the entirety of the visible spectrum.

* * * * *